(12) United States Patent
Wurczinger

(10) Patent No.: US 9,080,236 B2
(45) Date of Patent: Jul. 14, 2015

(54) TUBE TARGET

(75) Inventor: Dieter Wurczinger, Bad Vilbel (DE)

(73) Assignee: PRAXAIR S.T. TECHNOLOGY, INC., North Haven, CT (US)

( * ) Notice: Subject to any disclaimer, the term of this patent is extended or adjusted under 35 U.S.C. 154(b) by 133 days.

(21) Appl. No.: 13/145,681

(22) PCT Filed: Jan. 30, 2009

(86) PCT No.: PCT/EP2009/051102
§ 371 (c)(1),
(2), (4) Date: Nov. 18, 2011

(87) PCT Pub. No.: WO2010/086025
PCT Pub. Date: Aug. 5, 2010

(65) Prior Publication Data
US 2012/0103803 A1    May 3, 2012

(51) Int. Cl.
*C23C 14/34* (2006.01)
*H01J 37/34* (2006.01)

(52) U.S. Cl.
CPC ............ *C23C 14/3407* (2013.01); *H01J 37/342* (2013.01); *H01J 37/3423* (2013.01); *H01J 37/3491* (2013.01)

(58) Field of Classification Search
CPC .............................. H01J 37/342; H01J 37/3423
USPC .......................... 204/298.12, 298.21, 298.22
See application file for complete search history.

(56) References Cited

U.S. PATENT DOCUMENTS

| | | | | |
|---|---|---|---|---|
| 5,098,542 A | * | 3/1992 | Reinhardt et al. | 204/297.05 |
| 6,375,814 B1 | * | 4/2002 | De Bosscher et al. | 204/298.21 |
| 2001/0047936 A1 | | 12/2001 | McLeod | |
| 2004/0206620 A1 | * | 10/2004 | Wang et al. | 204/192.12 |
| 2005/0145488 A1 | * | 7/2005 | Erbkamm et al. | 204/298.21 |

FOREIGN PATENT DOCUMENTS

| | | |
|---|---|---|
| DE | 102005020250 A1 | 11/2006 |
| DE | 102006060512 A1 | 6/2008 |
| EP | 0500031 A1 | 8/1992 |
| EP | 1752556 A1 | 2/2007 |
| JP | 4350161 A | 12/1992 |
| JP | 2006-083408 | 3/2006 |
| WO | WO2006/063721 A1 | 6/2006 |
| WO | WO2007/041425 A2 | 4/2007 |

* cited by examiner

*Primary Examiner* — Jason M Berman
(74) *Attorney, Agent, or Firm* — Nilay S. Dalal; Iurie A. Schwartz

(57) ABSTRACT

The invention relates to a tube target (50) for sputtering, with a target (46) disposed on a cylindrical carrier tube. This target (46) is divided into several segments. The target (46) includes at least one groove (51-54) extending obliquely with respect to its rotational axis.

13 Claims, 4 Drawing Sheets

Fig. 1
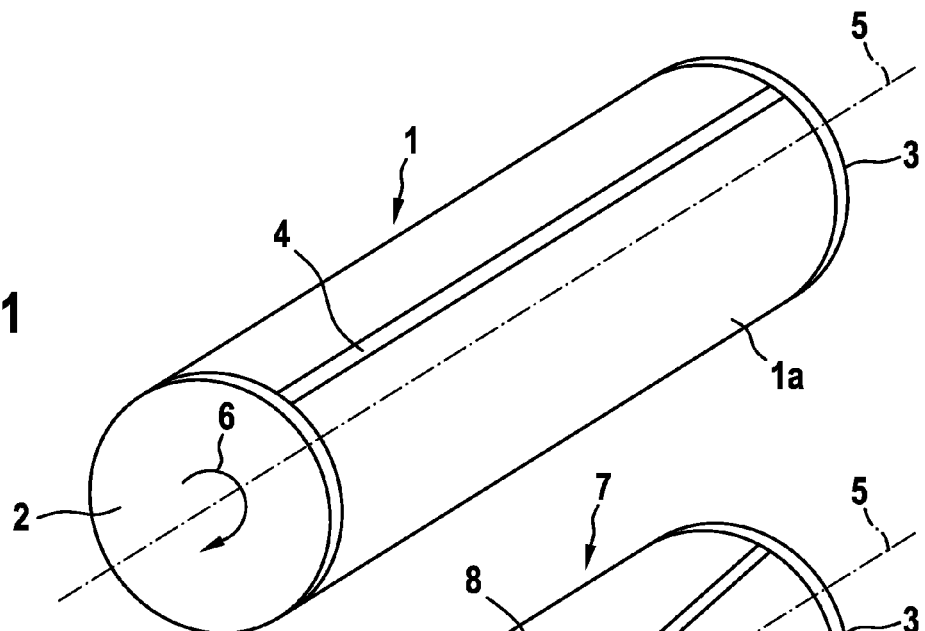
Fig. 2
Fig. 3
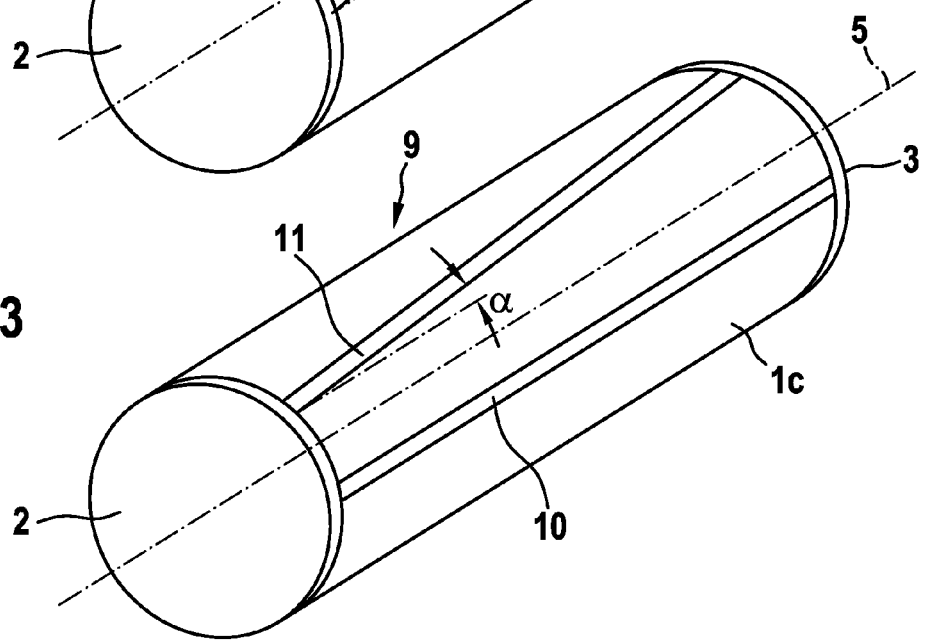

A - A

TUBE TARGET

FIELD OF THE INVENTION

This invention relates to a tube target according to the preamble of claim 1.

BACKGROUND OF THE INVENTION

Most sputter targets used in the past are so-called planar targets which are formed circularly or rectangularly. These planar targets, however, have the disadvantage that only approximately 30% to 40% of the material of which it is comprised are effectively sputtered.

To increase the effectiveness of sputtering, tubular targets are increasingly employed. Their production, however, is more difficult than the production of planar targets.

A method for the production of a sputtering target is already known, in which, first, a cylindrical carrier element is introduced into a casting mold such that an empty volume is formed between the carrier element and the casting mold (EP 0 500 031 B1).

A target material is hereupon filled into this empty volume between the carrier element and the casting mold and the casting mold is closed. An isostatic hot pressing is subsequently applied onto the target material and the carrier element. Through the isostatic pressing the bonding force between the target material and the outer surface of the carrier element is improved.

A tube cathode for use in a sputter process is furthermore known, which comprises a target carrier and a target, wherein between target carrier and target an electrically and thermally well conducting layer is located (EP 1 752 556 A1). The thermally well conducting layer is herein divided into several individual layers along the longitudinal axis of the target carrier, which layers are spaced apart from one another.

Segmenting a tube target perpendicularly to the longitudinal axis is disclosed in WO 2007/0414125 A2. The cylindrical target herein has a length of more than approximately 36 inches (=approximately 91 cm) and has one or several cylindrical sputter sections. Within the cylindrical target is provided a carrier pipe. A fastening layer of indium is located between the cylindrical sputter target and the cylindrical carrier pipe in order to connect the target with the carrier pipe.

There is furthermore known a tube target with a cylindrical carrier tube and at least one target tube disposed on its shell surface (WO 2006/063721 A1). Herein between the target tube and the carrier tube a connection layer is disposed which is conductive and which has a degree of wetting >90%.

Similar tube targets are disclosed in the following publications: US 2001/0047936 A1; JP 4350161; JP 2006-083408.

The known tube cathodes are heated so strongly during the sputter process that they must be cooled by means of cooling water. Since the requirements made of the power density of tube cathodes becomes increasingly higher, the cooling must also become ever more efficient. Herein large temperature differences occur between the inner wall and the outer wall of the target tube. That is to say the inner wall rests on the outer wall of a carrier tube in whose interior the cooling water is transported, while the outer wall is exposed to the hot plasma. Through the action of the plasma, high temperatures result whereby the target expands. Since the target is simultaneously cooled through the interior cooling, a temperature gradient forms over the thickness of the target. Since, however, the target also expands due to the high temperatures of the plasma, radial tear-off forces occur, which lead to damage or even destruction of the target making uniform coating no longer possible.

BRIEF SUMMARY OF THE INVENTION

The invention therefore addresses the problem of relieving the stresses between the inside and the outside of the target.

This problem is resolved according to the features of patent claim 1.

The invention relates to a tube target for sputtering with a target disposed on a cylindrical carrier tube. This target is divided into several segments. The target has at least one groove parallel or obliquely to its rotational axis.

The tube target includes preferably a cylindrical carrier tube, with a cylindrical target disposed thereon which is divided into at least one segment. A connection piece is provided between the target and the carrier tube. The target includes at least one groove parallel and/or obliquely to its rotational axis.

The advantage attained with the invention comprises in particular that the stresses in the tube target are relieved. This stress relief is attained by applying at least one groove in the target. Through this groove, the radial tear-off forces are converted into tangential forces. Through these tangential forces the at least one groove is narrowed or even closed. The tearing-off of the target is thus prevented. This stress relief is advantageous in particular with brittle target material, for example in the case of tube targets of ITO, ZnO, ZnO:Al$_2$O$_3$, ZnO:Ga$_2$O$_3$, ZnO:In$_2$O$_3$ or with other dopings, or SnO$_2$, SnO$_2$ with Sb, respectively, and other dopings; and further oxides and suboxides, such as for example Nb$_2$O$_x$, Ta$_2$O$_x$, WO$_x$, MoO$_x$, Ti$_x$Nb$_y$O$_z$, TiO$_x$, SiO$_2$, Al$_2$O$_3$, Si$_3$O$_x$, MgO$_x$, silicon, compounds of Si and Al, nitrides, for example TiN, ZrN, Si$_3$N$_x$, carbides such as for example SiC, WC, silicides, borides, fluorides, selenides, sulfides, tellurides and mixtures of these substances. However, the invention can also be employed with advantage with targets of metals and metal alloys as well as their compounds.

Embodiment examples of the invention are depicted in the drawing and will be described in further detail in the following.

BRIEF DESCRIPTION OF THE DRAWINGS

FIG. 1 a perspective view of a tube target with a straight groove;

FIG. 2 a perspective view of a tube target with an oblique groove;

FIG. 3 a perspective view of a tube target with one straight and one oblique groove;

DETAILED DESCRIPTION OF THE INVENTION

Figure 4:
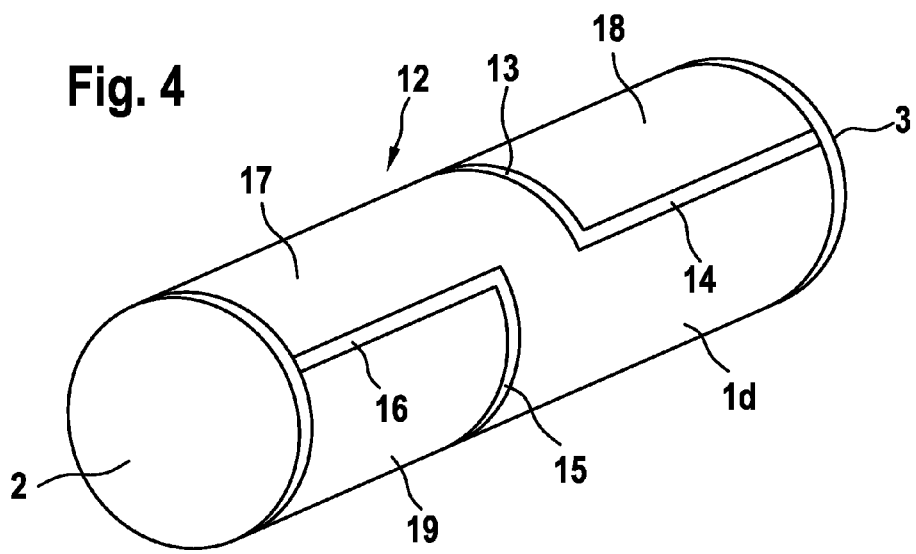
FIG. 4 a perspective view of a tube target with straight grooves and grooves extending perpendicularly thereto.

FIG. 1 depicts in perspective view and schematically a tube target 1. For the sake of clarity, it is here closed off with caps 2, 3. This tube target 1 comprises a carrier tube, not evident in FIG. 1, which is encompassed by a target 1a. This target 1a is provided with a groove 4 extending parallel to a rotational axis 5 of the tube target 1. An arrow 6 indicates the rotational direction. The depth of the groove 4 is not specified.

During the sputter process a plasma is located above or beneath a portion of the tube target 1. This plasma is substantially as long as the tube target 1, however has a diameter less than the diameter of the tube target 1. When the tube target 1 rotates, the groove 4 is located with its entire length above or beneath the plasma when [the groove] travels below or above the plasma. The immersion, dwelling and exiting of the groove 4 into, in or from the plasma changes the surface of target 1a facing the plasma and therewith the plasma impedance. The sputter behavior can hereby be severely impaired. Herein voltage and current changes can occur which, in turn, cause flash-overs (arcing) that can damage the substrate to be coated.

FIG. 2 depicts a variant of the tube target according to FIG. 1, which includes a target 1b. The target 1b of this tube target 7 includes a groove 8 which does not extend parallel to the rotational axis 5, but rather at an angle α thereto.

During the rotation of the cylindrical target 1b the groove 8 starts to become immersed into the plasma from one end of the target 1b and subsequently continues in the plasma toward the other end of the target 1b. The change of the plasma impedance is hereby kept small.

FIG. 3 shows a further tube target 9 whose cylindrical target 1c includes two grooves 10, 11, wherein the one groove 10 extends parallel to the rotational axis 5 and the other extends at an angle α hereto.

FIG. 4 shows a further tube target 12 whose target 1d is divided by grooves 13 to 16 into several segments 17, 18, 19. Herein grooves 13, 15 extend perpendicularly to grooves 14, 16.

Figure 5:
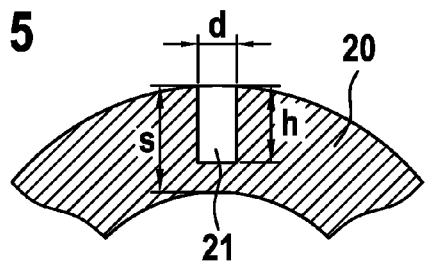
FIG. 5 a cross section through a cutaway of a tube target with a groove before a plasma heat action.

FIG. 5 shows a portion of a target 20 in cross section. Evident is herein a groove 21 with width d and depth h. Depth h is herein less than the thickness s of the target 20.

Figure 6:
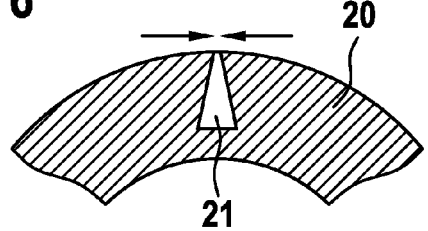
FIG. 6 the cross section according to FIG. 5 after the plasma heat action.

FIG. 6 shows the same sector of target 20 as FIG. 5, however, after the action of high plasma heat. The originally constant groove 21 is herein narrowed due to the expansion of the target 20 in the direction toward the outer surface of target 20.

Figure 7:
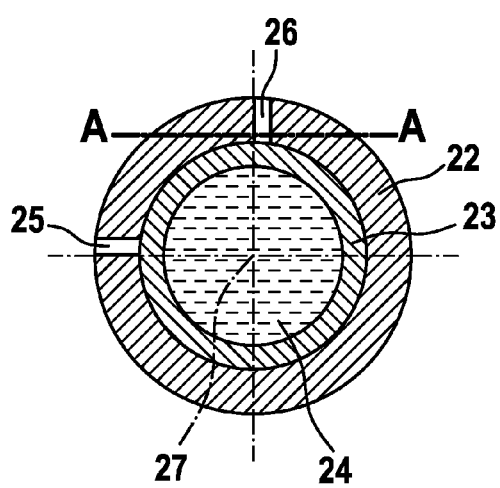
FIG. 7 a cross section through a target disposed on a target carrier.

FIG. 7 shows a target 22 disposed on a carrier tube 23. Within the carrier tube 23 cooling means 24 can be seen. The two grooves 25, 26 extend herein through the entire target 22 up to the surface of the carrier tube 23 and they extend in the same direction as the rotational axis 27.

The disposition of the target 22 on the carrier tube 23 is shown simplified in FIG. 7. For example, the bonding has been omitted.

Figure 8:
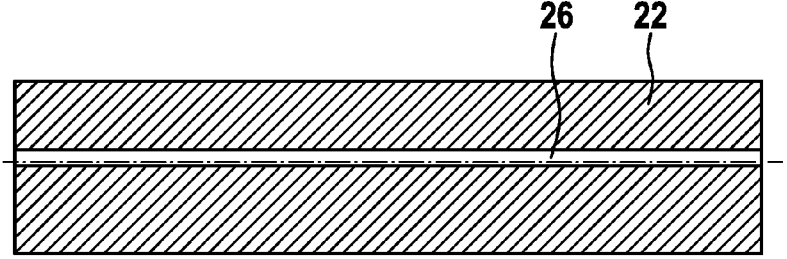
FIG. 8 a longitudinal section through the target according to FIG. 7.

In FIG. 8 the cylindrical target 22 of FIG. 7 is rotated by 90° and depicted in a section A-A. Again, the groove 26 can be seen.

Figure 9:
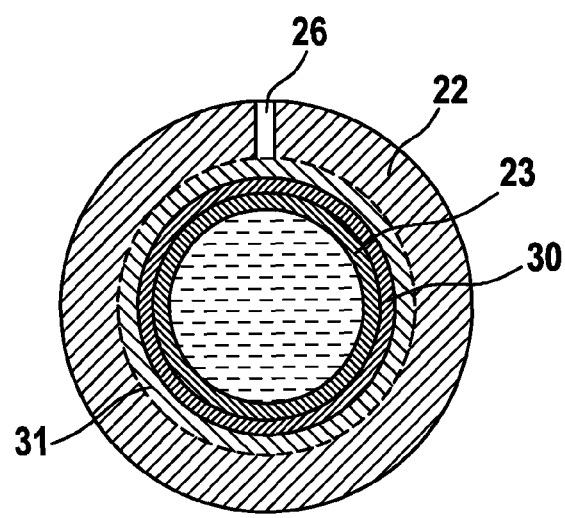
FIG. 9 a cross section through a tube target.

FIG. 9 shows a similar arrangement as FIG. 7, however, with a bonding means 30, for example indium-tin as a solder. This bonding means 30 is disposed between the carrier tube 23, which is preferably comprised of copper, and the cylindrical target 22. By 31 is denoted a non-slotted region of target 22. The portion of target 22 which is to be sputtered, is consequently not bonded. Slot or groove 26 is herein only carried up to the region 31 of target 22. The sputter layer can hereby not be contaminated with bonding means 30.

Figure 10:
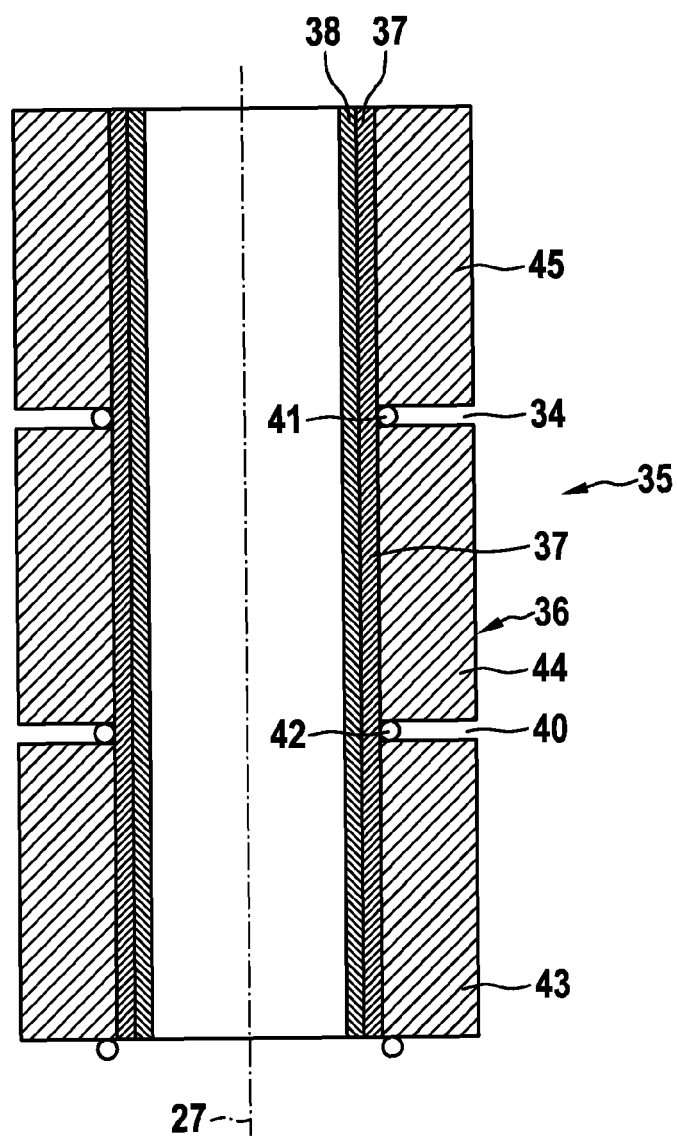
FIG. 10 a longitudinal section through a variant of a tube target.

FIG. 10 depicts a variant of a segmented tube target 35 with segmented target 36. This target 36 rests on a bond layer 37, which, in turn, encompasses a carrier tube 38. In grooves 34, 40 sealing rings 41, 42 are provided. These sealing rings 41, 42 are only required during the mounting of the tube target 35 onto the carrier tube 38. During this mounting the segments 43 to 45 with the sealing rings 41, 42 are slid over the carrier tube 38. Hereupon into the interspace between carrier tube 38 and target 36 is poured a liquid bonding means 37 which later cures. While the bonding means 37 is poured in, the sealing rings 41, 42 serve for preventing the bonding means 37 from flowing out of grooves 34, 40. After the bonding means 37 has cured, the sealing rings 41, 42 are preferably removed.

The carrier tube 38 extends at all sites concentrically with respect to the target 36. In order to attain such, wires or spot- or line-shaped spacers are inserted during the mounting.

Figure 11:
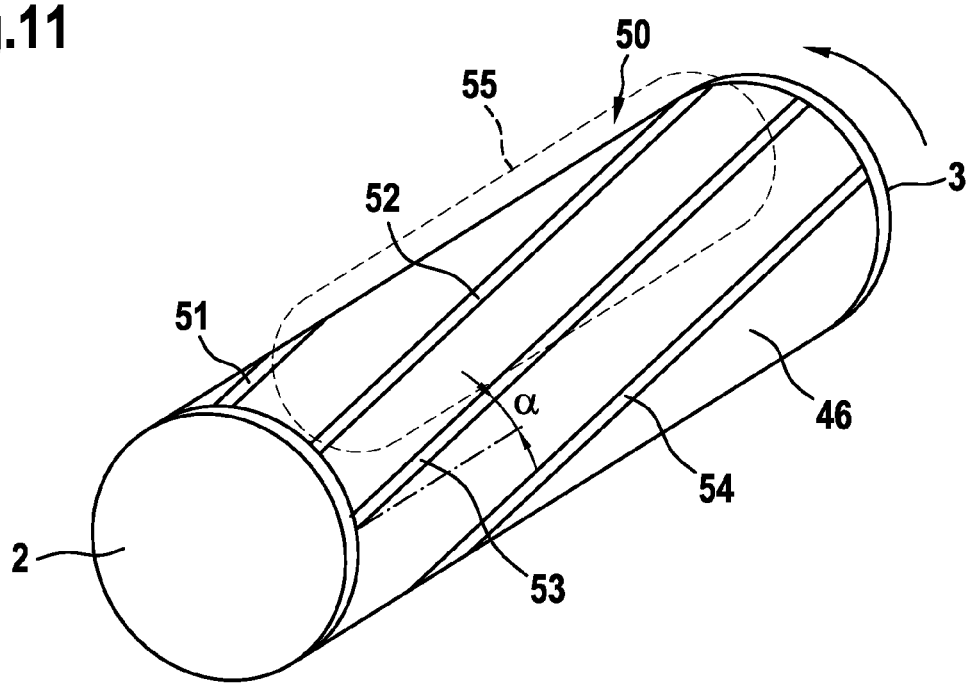
FIG. 11 a perspective view of a tube target with several oblique grooves.

FIG. 11 depicts a tube target 50 with a target 46, which, in principle, corresponds to the tube target according to FIG. 2, however with several oblique grooves 51 to 54. Above the tube target 50 a plasma zone 55 is indicated. By utilizing several oblique grooves 51 to 54, the risk of arcing to occur is further reduced. Angle α of grooves 51 to 54 formed with the longitudinal axis of tube target 50 is preferably so selected that the one end, for example of groove 52, enters the plasma zone 55 when the other end of this groove 52 emerges from the plasma zone 55.

Correspondingly, the one end of the succeeding groove 53 enters the plasma zone 55 when the last end of the preceding groove 52 exits from the plasma zone 55. The angle α can be determined with tan α=b/L. Herein is b the maximal width of the plasma zone 55 and L the length of target 46. Grooves 51 to 54 have herein the same distance with respect to one another.

Although above the embodiment examples of the invention have been described in detail, the invention is not limited to these embodiment examples. A person of skill in the art understands that the invention encompasses several variants with which the same result is attained as with the embodiment examples described here. It is therefore clear to the person of skill in the art that with the embodiment examples described here the scope of protection of the claims is not restricted and that there are further variants, modifications and alternatives which are within the protective scope of the claims.

LIST OF REFERENCE NUMBERS

1 Tube target
1a Target
1b Target
1c Target
1d Target
2 Cap
3 Cap
4 Slot or groove
5 Rotational axis
6 Arrow
7 Tube target
8 Groove
9 Tube target
10 Groove
11 Groove
12 Tube target
13 Groove
14 Groove
15 Groove
16 Groove
17 Segment 18 Segment
19 Segment
20 Target
21 Groove
22 Target
23 Carrier tube
24 Cool
25 Groove
26 Groove
27 Rotational axis
30 Bonding means
31 Unslotted region
34 Groove
35 Tube target
36 Target
37 Bond layer/bonding means
38 Carrier tube
40 Groove
41 Sealing ring
42 Sealing ring
43 Segment
44 Segment
45 Segment
46 Target
50 Tube target
51 Groove
52 Groove
53 Groove
54 Groove
55 Plasma zone

What is claimed is:

1. Tube target for sputtering with
   1.1 a cylindrical carrier tube (23, 38),
   1.2 a cylindrical sputtering target (22, 36, 46) divided into at least one curved segment (17-19, 43-45), which sputtering target is disposed on the carrier tube (23, 38),
   1.3 a connecting layer (30, 37) provided between the target (22, 36, 46) and the carrier tube (23, 38), whereby said connecting layer (30, 37) extends substantially the entire length of the cylindrical sputtering target (22, 36, 46),
   characterized in that the target (22, 36) includes parallel and/or obliquely to its rotational axis (5, 27) at least one groove (4, 8, 10, 11, 13, 14, 15, 16, 21, 25, 26, 34, 40, 51-54), wherein said target is divided by said at least one groove (4, 8, 10, 11, 13, 14, 15, 16, 21, 25, 26, 34, 40, 51-54) into said at least one curved segment (17-19, 43-45).

2. Tube target as claimed in claim 1, characterized in that the depth (h) of the at least one groove (4, 8, 10, 11, 13, 14, 15, 16, 21, 25, 26, 34, 40, 51-54) extends from the top side to the inside and amounts to more than 5% of the thickness (s) of the target (22, 36, 46).

3. Tube target as claimed in claim 1, characterized in that the at least one groove (4, 10, 25, 26) extends parallel to the rotational axis (5, 27) of the tube target (1, 9).

4. Tube target as claimed in claim 1, characterized in that the target includes several grooves (25, 26) which extend parallel to the rotational axis (27) of the tube target.

5. Tube target as claimed in claim 1, characterized in that the target (1b, 1c, 46) includes at least one groove (8, 11, 51-54) comprising a first end and a second end, wherein said at least one groove (8, 11, 51-54) extends at an angle α to the rotational axis (5) of the tube target (7, 9, 50) wherein said angle is selected so that the first end enters a plasma zone (55) when the second end emerges from the plasma zone (55).

6. Tube target as claimed in claim 1, characterized in that the target (1c) includes several grooves (10, 11) of which at least one extends parallel and at least one at an angle α to the rotational axis (5) of the tube target (9).

7. Tube target as claimed in claim 1, characterized in that several grooves (51-54) extend at an angle α to the rotational axis of the tube target (50).

8. Tube target as claimed in claim 7, characterized in that the grooves (51-54) have each the same distance with respect to one another.

9. Tube target as claimed in claim 1, characterized in that the target (1a, 1b, 1c) is divided into at least two segments in the longitudinal direction.

10. Tube target as claimed in claim 8, characterized in that the distance of the grooves (51-54) with respect to one another corresponds at least to the width of a plasma zone (55).

11. Tube target as claimed in claim 1, wherein the cylindrical sputtering target (22, 36, 46) is formed from ITO, ZnO, $ZnO:Al_2O_3$, $ZnO:Ga_2O_3$, $ZnO:In_2O_3$, $SnO_2$, $SnO_2$ with Sb, $Nb_2O_x$, $Ta_2O_x$, $WO_x$, $MoO_x$, $Ti_xNb_yO_z$, $TiO_x$, $SiO_2$, $Al_2O_3$, $Si_3O_x$, $MgO_x$ silicon, compounds of Si and Al, TiN, ZrN, $Si_3N_x$, carbides such as for example SiC, WC, silicides, borides, fluorides, selenides, sulfides, tellurides and mixtures thereof.

12. Tube target as claimed claim 1, wherein said cylindrical carrier tube (23, 38) is formed from copper.

13. Tube target as claimed in claim 1, wherein said connecting layer (30, 37) is an indium tin solder.

* * * * *